United States Patent
Holmes et al.

(10) Patent No.: US 6,440,635 B1
(45) Date of Patent: Aug. 27, 2002

(54) LOW "K" FACTOR HYBRID PHOTORESIST

(75) Inventors: Steven J. Holmes, Milton, VT (US); Ahmad D. Katnani, Poughkeepsie; Niranjan M. Patel, Wappingers Falls, both of NY (US); Paul A. Rabidoux, Winooski, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/675,608

(22) Filed: Sep. 29, 2000

Related U.S. Application Data

(63) Continuation of application No. 08/715,288, filed on Sep. 16, 1996.

(51) Int. Cl.[7] .............................................. G03F 7/039
(52) U.S. Cl. .................... 430/270.1; 430/326; 430/905; 430/170; 430/191; 430/192; 430/909; 430/910
(58) Field of Search .............................. 430/270.1, 905, 430/326, 191, 170, 192, 909, 910

(56) References Cited

U.S. PATENT DOCUMENTS

| | | | |
|---|---|---|---|
| 4,405,708 A | 9/1983 | van Pelt et al. | 430/281.1 |
| 4,568,631 A | 2/1986 | Badami et al. | 430/315 |
| 4,687,730 A | 8/1987 | Eron | 430/324 |
| 4,707,218 A | 11/1987 | Giammarco et al. | 156/643 |
| 4,889,789 A | * 12/1989 | Stahlhofen | 430/270.1 |
| 5,008,175 A | * 4/1991 | Hsieh et al. | 430/270.1 |
| 5,070,001 A | * 12/1991 | Stahlhofen et al. | 430/270.1 |
| 5,120,633 A | 6/1992 | Bauer et al. | 430/176 |
| 5,210,000 A | 5/1993 | Thackeray et al. | 430/270.1 |
| 5,296,332 A | 3/1994 | Sachdey et al. | 430/270.1 |
| 5,330,879 A | 7/1994 | Dennison | 430/313 |
| 5,556,734 A | 9/1996 | Yamachika et al. | 430/192 |
| 5,585,218 A | 12/1996 | Nakano et al. | 430/270.1 |
| 5,650,261 A | * 7/1997 | Winkle | 430/270.1 |
| 5,731,125 A | * 3/1998 | Yamachika et al. | 430/270.1 |

FOREIGN PATENT DOCUMENTS

JP      05-297597      11/1993

* cited by examiner

Primary Examiner—John S. Chu
(74) Attorney, Agent, or Firm—Schmeiser, Olsen & Watts; Mark F. Chadurjian

(57) ABSTRACT

A photoresist having both positive and negative tone components resulting in a lower "k" factor than the single tone photoresist is disclosed. The hybrid resist may either have the negative tone resist or the positive tone resist as the major portion, while the other tone is a relatively minor portion. For examples, a positive tone resist may include a minor portion of a negative tone cross-linker or a negative tone resist may include positively acting functional groups. The hybrid resist of the present invention allows for wider exposure dosage windows, therefore increasing the yield or performance and line density.

8 Claims, 2 Drawing Sheets

• enhanced "k" factor resist
× standard positive tone resist

LOW "K" FACTOR HYBRID PHOTORESIST

This application is a Continuation of Ser. No. 08/715,288, filed on Sep. 16, 1996.

This application is a sister application to the co-pending U.S. application, Ser. No. 08/715,287 filed this same day and incorporated herein by reference.

BACKGROUND OF THE INVENTION

1. Technical Field

The present invention relates generally to the fabrication of semiconductor devices and, more specifically, to a photoresist material having both negative and positive characteristics so that the processing windows are wider.

2. Background Art

Manufacturing of semiconductor devices is dependent upon the accurate replication of computer aided design (CAD) generated patterns onto the surface of a device substrate. The replication process is typically performed using lithographic processes followed by a variety of subtractive (etch) and additive (deposition) processes.

Photolithography, a type of lithographic process, is used in the manufacturing of semiconductor devices, integrated optics, and photomasks. The process basically comprises: applying a layer of a material that will react when exposed to actinic energy, known as a photoresist or, simply, a resist; selectively exposing portions of the photoresist to light or other ionizing radiation, i.e., ultraviolet, electron beams, X-rays, etc., thereby changing the solubility of portions of the resist; and developing the resist by washing it with a basic developer solution, such as tetramethylammonium hydroxide ("TMAH"), thereby removing the non-irradiated (in a negative resist) or irradiated (in a positive resist) portions of the layer.

As the need for higher and higher levels of integration has arisen in the industry, the need for a larger number of lines and spaces in a given area has increased dramatically. In response, the scaling of lithographic features has been an essential aspect of enhancing the performance and density of semiconductor devices. Lithographic scaling has been achieved primarily by three methods: increasing the numerical aperture (NA) of the expose tool; reducing the exposure wavelength; and improving the response of the photoresist. These three parameters are expressed in the Rayleigh model for lithographic resolution, as given by the equation:

$$R = k\lambda/NA$$

where R is the resolution, k is an empirically derived parameter that is dependent on photoresist performance, $\lambda$ is the expose wavelength, and NA is the numerical aperture of the expose tool.

The "k" factor is reduced by resists that can provide a wider focus/expose process window for a high resolution feature. Historically, this "k" factor has been reduced by altering the resist components for example: by adding resins and sensitizers with higher contrast; employing thinner resist films; and using anti-reflective films. The reduction of the "k" factor is becoming more important because NA values are reaching their limit at 0.65–0.70 and since work at reducing the expose wavelength from the state-of-the art of 248 nm is still in preliminary stages.

Therefore, there is a desire for a photoresist material that overcomes one or more of the aforementioned shortcomings.

SUMMARY OF THE INVENTION

The present invention performs the functions of the usual photoresist, be it negative or positive, with less sensitivity to process conditions, i.e., a reduced "k" factor, allowing a wider range of conditions, such as exposure dose, while still maintaining the dimensions within allowable limits. Conversely, for a given process latitude, the smallest feature that can be resolved in the resolution of the resist can also be improved by using the concepts embodied in the present invention. These functions are performed by utilizing a photoresist substance that includes not only the traditional negative photoresist, but also "doping" the negative resist material with a proportion of a positive resist material. In a like manner, a positive tone photoresist material may be "doped" with an amount of a negative resist material.

It is an advantage of the present invention that the exposure latitude may be increased significantly, providing better control of feature size at all levels: lot-to-lot; wafer-to-wafer; within wafer; and within chip. This greater level of feature control may in turn either give rise to a higher yield of product at a particular feature size because errors are not as harmful to overall device fabrication or the feature size may be shrunk while still maintaining line width control thus gaining greater performance and density.

The foregoing and other features and advantages of the invention will be apparent from the following more particular description of preferred embodiments of the invention.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE PREFERRED EMBODIMENTS

Figure 1:
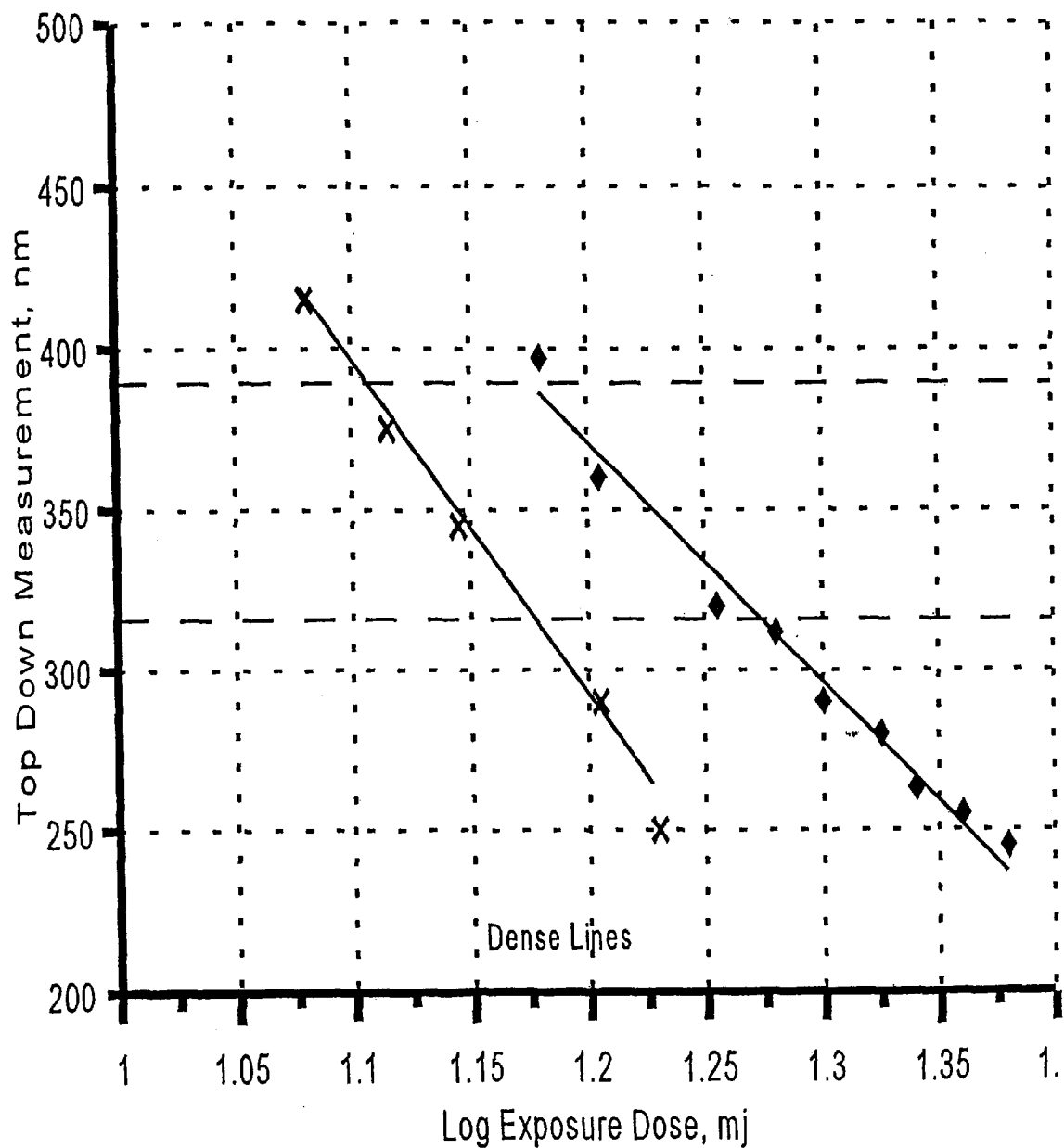
FIG. 1 is a graph plotting the width of lines printed using the present invention versus the exposure dose, thereby showing the range of acceptable doses is greater with the enhanced k factor resist than without.

Accordingly, improved, reduced "k" factor resists are provided by the present invention in which a first radiation induced response and a second radiation induced response are combined in a single resist formulation and are induced by a single excitation event. For example, the first radiation induced response may be a light induced response causing the resist to become soluble in exposed areas while the second radiation induced response may be the negative tone type action of a crosslinker causing the light affected areas to become higher in molecular weight, thereby decreasing the solubility of the resist material.

This concept is applicable to both positive tone systems as well as negative tone systems. In the positive tone system formulation, which shall be referred to as an "enhanced positive resist" to distinguish from the conventional positive resists, a negative acting component, such as a cross-linking agent, is used as a minor additive, thereby imparting a certain amount of negative tone chemistry to the resist formulation. Conversely, the performance or "k" factor of a negative resist is improved by addition of an appropriate proportion of a positive acting component. Such a resist shall be referred to as an "enhanced negative resist." It is believed that the increased exposure latitude is obtained because the positive and negative components of the decreased "k" factor resists counterbalance each other at the edge of the exposed image. As the positive tone resin is exposed to become soluble in the developer, the negative tone function begins to cross-link the resin and reduces its solubility. Surprisingly, the combination provides a "buffer" against variations in exposure dose without a reduction in contrast or resolution capability.

The positive tone system may include as the major, active portion of the resist material any of a number of positive tone resist materials, including, but not limited to, partially protected polyhydroxystyrenes. Suitable compositions of the enhanced positive resist include those shown in Table 1. Examples of materials that can be employed in accordance with this invention and their relative proportions in typical formulations are also provided in Table 1.

TABLE 1

Components of an Enhanced Positive Resist

| Component | Examples | Typical Content |
|---|---|---|
| Partially protected polyhydroxystyrene | protecting group: any acid labile moiety such as acetal, ketal or acrylate incorporated in the backbone or as a side chain; protection typically in the range of 10 to 30% | 84–99% of solids by weight |
| Photoacid generator | sulfonium salts, onium salts, triazines, dicarboximide sulfonates, 2,1,4-DNQ esters, dinitrobenzyl sulfonates, bisaryl sulfonyl diazomethanes, imine sulfonates, aryl sulfonate esters, or any other known PAG. | 1–15% of solids by weight |
| Crosslinker | multifunctional groups such as: tetramethoxymethyl glycoluril (Powderlink) availability from Cytec, Danbury, CT or any multifunctional group capable of reacting with the polyhydroxystyrene | 0.1–1.0% of solids by weight |
| Solvent | propyleneglycol mono-methylether acetate (PM acetate) ethyl lactate, cyclohexanone or any other commonly known solvents | 70–85% of total by weight |

Additionally, photosensitizers and base additives may be utilized to further enhance the reactions of the photoresist. Sample base additives include: dimethyl amino pyridine; 7-diethylamino-4-methyl coumarin (Coumarin 1), tertiary amines, proton sponge, berberine, and the polymeric amines as in the "Pluronic" or "Tetronic" series from BASF. Additionally, tetra alkyl ammonium hydroxides or cetyl methyl ammonium hydroxide may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

In accordance with preferred embodiments of this invention, the positive tone function (i.e., the deblocking chemistry) operates relatively less dependently on a post expose bake (PEB), whereas the negative tone function (i.e., the cross-linking chemistry) varies in response to the PEB temperature. Therefore, the relative responses of the two tones may be modified simply by altering the PEB temperature. In this manner, one may optimize the extent to which the crosslinking or negative chemistry affects the lithographic performance. Too little negative chemistry does not allow the benefits to be fully realized in terms of better exposure dose latitude or resolution. On the other hand, too much negative chemistry will give rise to unwanted effects such as scumming, residue, etc. in the exposed region.

EXAMPLE 1

While one particular preferred positive tone system is illustrated by this example, it is to be understood of course, that many other examples are within the scope of the present invention.

The following ingredients were dissolved in PM acetate solvent for a total of 18.9% solids:

polyhydroxystyrene (PHS), available from Maruzen America, New York, N.Y. with ~24% of phenols protected with methoxypropene (MOP), 97.5% of solids;

triphenyl sulfonium triflate, 1.4% of solids; tetramethoxymethyl glycoluril (Powderlink), available from Cytec, Danbury, Conn., 1.0% of solids; and tetrabutylammonium hydroxide, 0.1% of solids.

The resulting solution was filtered and applied to silicon wafers to a thickness of approximately 0.8 $\mu$m. The coated wafers were subjected to a soft-bake of 110° C. for 60 sec and exposed with a 248 nm excimer laser source in a 0.37 NA Canon stepper through a mask with appropriate nested and isolated lines and spaces. The wafers were post expose baked (PEB) to 110° C. for 90 seconds and developed with 0.14 Normal (N) TMAH developer for 120 seconds. The lithographic performance was compared with that of an identical formulation as above except with no Powderlink. FIG. 1 shows that the dose latitude of this enhanced positive resist is about one and one-half times that of the conventional resist as measured by positive tone response in a given dose range.

In a negative tone system, the primary photo-response is from the negative tone resist material, however, the addition of a positive tone resist material or merely addition of groups that will function with positive tone chemistries, such as ketal groups, again enhances the exposure latitude. Suitable components of an enhanced negative tone resist include those shown in Table 2. Example materials that can be employed in accordance with this invention and their relative proportions in typical formulations are also provided in Table 2.

TABLE 2

Components of a Enhanced Negative Resist.

| Component | Examples | Typical Content |
|---|---|---|
| Partially protected polyhydroxystyrene or a mixture of | protecting group: ketal, acetal, tetrahydrofuran, | 75–95% of solids by weight |

TABLE 2-continued

Components of a Enhanced Negative Resist.

| Component | Examples | Typical Content |
|---|---|---|
| partially protected polyhydroxystyrene with polyhydroxystyrene | acrylate. Protection typically in the range of 10 to 30% | |
| Photoacid Generator | sulfonium salts, onium salts, triazines, dicarboximide sulfonates, 2,1,4-DNQ esters, dinitrobenzyl sulfonates, bisaryl sulfonyl diazomethanes, imine sulfonates, aryl sulfonate esters, or any other PAG | 1–15% of solids by weight |
| Crosslinker | Powderlink or other crosslinkers as listed in Table 1 | 4–10% of solids by weight |
| Solvent | PM Acetate, ethyl lactate, cyclohexanone or any other commonly known solvents | 70–85% of total by weight |

Again, photosensitizers and base additives, such as those listed above may be used to enhance the clarity of the final lines and spaces and to change the type of radiation or wavelength at which the photoresist material responds to the actinic radiation.

It should be pointed out that the difference between the enhanced positive resist and the enhanced negative resist illustrated in Tables 1 and 2 is not in the number or the type of components, however, it resides in the relative proportion of the crosslinker that is employed. In the case of an enhanced positive tone resist, the crosslinker is used in a relatively small quantity. The purpose here is not to obtain the negative tone response, but to slow down the positive tone in a given dose range. In the case of an enhanced negative tone resist, the crosslinker content is relatively higher, which is typical of a conventional negative tone resists, as will be apparent to those skilled in the art. In this case, however, the negative tone resin has blocking or protecting groups that are induced by radiation to become deblocked. This deprotection reaction renders the entire resin more soluble and provides the counterbalancing chemistry simultaneously with the predominant negative crosslinking chemistry.

The following examples are again merely illustrative of the present invention and are not meant to be limiting as many other formulations should be readily apparent to those skilled in the art.

EXAMPLE 2

The following ingredients were dissolved in PM acetate solvent for a total of 20% solids:

PHS, 10% hydrogenated with about 24% of phenols protected with MOP, 81.2% of solids;
N-(trifluoromethylsulfonyloxy)-bicyclo-[2.2.1]-hept-5-ene-2,3-dicarboximide (MDT) available from Daychem Labs, Centerville, Ohio, 10.5% of solids;
Powderlink, 8.2% of solids; and
Coumarin 1, 0.1% of solids.

Figure 2:
FIG. 2 is a scanning electron micrograph of lines and spaces printed using the enhanced k factor photoresist of the present invention.

The resulting solution was filtered and applied to silicon wafers to a thickness of about 0.8 μm. The coated wafers were subjected to a soft-bake of 110° C. for 60 sec and exposed with a 248 nm excimer laser source on a 0.37NA Canon stepper through a mask with appropriate nested and isolated lines and spaces. The wafers were post expose baked at 110° C. for 60 sec and developed with a 0.263N TMAH developer for 60 sec. As shown in FIG. 2, the smallest line resolved in this case was 250 nm. This translated to a k factor of 0.37. When formulations were made identical to those above, except that the MOP protected PHS was replaced with an unprotected PHS, and were processed in the same manner, the minimum resolution obtained was 300 nm with a k factor of 0.45. Thus, the former formulations had a k factor enhancement of nearly 20% over the latter.

While the invention has been particularly shown and described with reference to preferred exemplary embodiments thereof, it will be understood by those skilled in the art that the foregoing and other changes in form and details may be made therein without departing from the spirit and scope of the invention.

What is claimed is:

1. A composition comprising:

a positive tone photoresist material having an aqueous base soluble organic portion wherein the aqueous base soluble organic portion is partially protected with acid labile moieties as protective groups, wherein the degree of protection is sufficient to render the composition initially insoluble in aqueous base and may be de-blocked to increase solubility; and a glycoluril cross-linker, wherein a percent by weight based on the organic portion is less than about 1.0, and wherein the composition is rendered aqueous base soluble after the single excitation event even though the solubility of the exposed composition is reduced by the amount of glycoluril cross-linker.

2. The composition of claim 1, wherein the aqueous base soluble organic portion of the positive photoresist material includes phenol, and wherein the degree of protection from the acid labile moieties as protective groups is greater than or equal to 10 percent by weight of the phenol.

3. The composition of claim 1, wherein the acid labile moieties comprise acetals, ketals, or acrylates.

4. The composition of claim 3, wherein the acid labile moieties are selected from the group consisting of: acetals; ketals; and acrylates; and wherein the composition further includes a photoacid generator, selected from the group consisting of sulfonium salts and iodium salts, a cross-linker having multifunctional groups capable of reacting with the partially protected polyhydroxystyrene, and a solvent.

5. The composition of claim 4, further comprising a base additive.

6. The composition of claim 5, wherein the polyhydroxystyrene has about one-quarter of the phenols protected, wherein the acid labile moiety is methoxypropene, wherein the photoacid generator is triphenyl sulfonium triflate, wherein the cross-linker is tetramethoxymethyl-glycouril, the solvent is propyleneglycol monomethylether acetate and the base additive is tetrabutylammonium hydroxide.

7. The composition of claim 4, further comprising a sensitizer.

8. A composition comprising:
a) 84 to 99 weight percent total solids of a positive tone photoresist material having an aqueous base soluble organic portion wherein the aqueous base soluble organic portion is partially protected with acid labile moieties as protective groups, wherein the degree of protection is sufficient to render the composition initially insoluble in aqueous base and may be de-blocked to increase solubility upon exposure to acid;
b) 0.1 to about 1.0 weight percent total solids of a glycoluril crosslinker; and
c) 1 to 15 weight percent total solids of a photoacid generator, wherein the composition is rendered aqueous base soluble after a single excitation event.

* * * * *